United States Patent
Feng et al.

(10) Patent No.: US 11,233,100 B2
(45) Date of Patent: Jan. 25, 2022

(54) INTEGRATED DISPLAY PANEL INCLUDING PHOTODIODE, MANUFACTURING METHOD THEREOF AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiang Feng, Beijing (CN); Zhaokun Yang, Beijing (CN); Qiang Zhang, Beijing (CN); Sha Liu, Beijing (CN); Xiao Sun, Beijing (CN); Ruizhi Yang, Beijing (CN); Yun Qiu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 792 days.

(21) Appl. No.: 16/073,044

(22) PCT Filed: Jan. 5, 2018

(86) PCT No.: PCT/CN2018/071485
§ 371 (c)(1),
(2) Date: Jul. 26, 2018

(87) PCT Pub. No.: WO2018/176978
PCT Pub. Date: Oct. 4, 2018

(65) Prior Publication Data
US 2021/0202620 A1     Jul. 1, 2021

(30) Foreign Application Priority Data
Mar. 31, 2017  (CN) .......................... 201710209046.8

(51) Int. Cl.
*H01L 27/32* (2006.01)
*H01L 51/56* (2006.01)

(52) U.S. Cl.
CPC ...... *H01L 27/3234* (2013.01); *H01L 27/3246* (2013.01); *H01L 27/3258* (2013.01);
(Continued)

(58) Field of Classification Search
CPC ............ H01L 27/3234; H01L 27/3246; H01L 27/3258; H01L 27/3211; H01L 27/322;
(Continued)

(56) References Cited

U.S. PATENT DOCUMENTS

2007/0121035 A1    5/2007  Lee et al.
2009/0008665 A1    1/2009  Lee et al.
(Continued)

FOREIGN PATENT DOCUMENTS

CN    1971357 A      5/2007
CN    101339953 A    1/2009
(Continued)

OTHER PUBLICATIONS

International Search Report and Written Opinion in corresponding International Patent Application No. PCT/CN2018/071485, dated Apr. 12, 2018. 23 pages.

*Primary Examiner* — Lex H Malsawma
(74) *Attorney, Agent, or Firm* — Leason Ellis LLP (57) ABSTRACT

An integrated display panel and a preparation method thereof are provided. The integrated display panel includes a first base substrate and a second base substrate, the first base substrate and the second base substrate being disposed opposite to each other, the first base substrate being provided with a pixel unit thereon, the pixel unit including a plurality of sub-pixel units having different colors; the integrated display panel further includes an image acquisition module (Continued)

which includes a photo sensing unit disposed in each of the sub-pixel units, the photo sensing unit includes a photodiode disposed in a non-display region of the sub-pixel unit, the photodiode is configured to photoelectrically convert light from a target area to obtain an electric signal representing an image of the target area.

18 Claims, 4 Drawing Sheets

(52) U.S. Cl.
CPC ............ *H01L 51/56* (2013.01); *H01L 27/322* (2013.01); *H01L 27/3211* (2013.01); *H01L 27/3276* (2013.01); *H01L 2227/323* (2013.01)

(58) Field of Classification Search
CPC ................ H01L 27/3276; H01L 51/56; H01L 2227/323
See application file for complete search history.

(56) References Cited

U.S. PATENT DOCUMENTS

| | | |
|---|---|---|
| 2011/0069254 A1 | 3/2011 | Takama et al. |
| 2016/0266695 A1* | 9/2016 | Bae ..................... G06F 3/04166 |
| 2017/0017824 A1* | 1/2017 | Smith .................... G02B 6/005 |
| 2017/0161543 A1* | 6/2017 | Smith .................. G06K 9/0004 |
| 2019/0296055 A1* | 9/2019 | Lius ...................... H01L 27/124 |

FOREIGN PATENT DOCUMENTS

| | | |
|---|---|---|
| CN | 102037395 A | 4/2011 |
| CN | 107068716 A | 8/2017 |
| KR | 100722111 B1 | 5/2007 |
| KR | 100769432 B1 | 10/2007 |

* cited by examiner

INTEGRATED DISPLAY PANEL INCLUDING PHOTODIODE, MANUFACTURING METHOD THEREOF AND DISPLAY DEVICE

CROSS-REFERENCE TO RELATED PATENT APPLICATIONS

This application is a U.S. National Stage Application under 35 U.S.C. § 371 of International Patent Application No. PCT/CN2018/071485, filed Jan. 5, 2018, which claims the benefit of priority under 35 U.S.C. Section 119(e) of Chinese Patent Application number 201710209046.8 filed Mar. 31, 2017, both of which are incorporated by reference in their entireties.

TECHNICAL FIELD

Embodiments of the present disclosure relates to an integrated display panel, a manufacturing method thereof and a display device.

BACKGROUND

With the development of technology, display devices are widely used in people's daily lives. In order to make the appearance of the display device more beautiful and fashionable, the display device is more and more inclined to be in ultra-thin development.

At present, most display devices is provided with a front camera, and the thickness of the entire display device largely depends on the thickness of the front camera. The front camera comprises a photo sensing unit and a driving circuit for driving the photo sensing unit, wherein the photo sensing unit comprises a lens and a photodiode therein. In a technique known by the inventors, when the front camera is manufactured, it is typical to assemble individual parts of the front camera together and install them into the display device as a single component. However, in this manner, the thickness of the entire display device will be inevitably increased, which is not conducive to the development of ultra-thin display devices.

SUMMARY

At least one embodiment of the present disclosure provides an integrated display panel, comprising a first base substrate and a second base substrate, the first base substrate and the second base substrate being disposed opposite to each other, the first base substrate being provided with a pixel unit thereon, the pixel unit comprising a plurality of sub-pixel units having different colors; the integrated display panel further comprises an image acquisition module which comprises a photo sensing unit disposed in each of the sub-pixel units, the photo sensing unit comprises a photodiode positioned in a non-display region of the sub-pixel unit, the photodiode is configured to photoelectrically convert light from a target area to obtain an electric signal representing an image of the target area.

At least one embodiment of the present disclosure provides a manufacturing method of an integrated display panel, comprising: providing a first base substrate; forming a pixel unit having a plurality of sub-pixel units of different colors on the first base substrate; and forming a second base substrate on a surface of the pixel unit facing away from the first base substrate; the method further comprising forming a photo sensing unit in a non-display region of each of the plurality of sub-pixel units, the photo sensing unit comprising a photodiode, forming the photodiode in the non-display region of each of the plurality of sub-pixel units, the photodiode configured to photoelectrically convert light from the target area so as to generate an electric signal representing the image of the target area.

At least one embodiment of the present disclosure provides a display device comprising an integrated display panel according to an embodiment of the present disclosure and a driving circuit for driving the integrated display panel.

In the integrated display panel according to the embodiment of the present disclosure, a plurality of sub-pixel units corresponding to a image acquisition module are provided and each of the sub-pixel units comprises a photodiode in at least one photo sensing unit. Based on the above structure, in the integrated display panel, light from a target area acquired by the lens is photoelectrically converted by the photodiode, thereby generating an electric signal representing an image of the target area, and thus generating an image of the target area. Thus, the photodiode being integrated in the sub-pixel unit of the integrated display panel overcomes the problem in a technique known by the inventors, in which the thickness of the entire display device is increased by having the front camera installed in the display device as a separate component. Therefore, with the integrated display panel according to the present embodiment, the thickness of the entire display device can be reduced, which is advantageous for the development of ultra-thin display devices.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

REFERENCE NUMERALS

1—first base substrate
2—second base substrate
3—photo sensing unit
4—photodiode;
5—lens
6—thin film transistor;
7—light-emitting element;
8—planarization layer;
9—light transmissive layer;
10—color filter layer;
71—anode;
72—organic light-emitting layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

It should be noted that the number of sub-pixel units and the number of light-emitting diodes comprised in each sub-pixel unit as illustrated in the accompanying drawings in connection with the following embodiments are only illustrative, and does not indicate the actual numbers thereof.

Embodiment One

Figure 1:
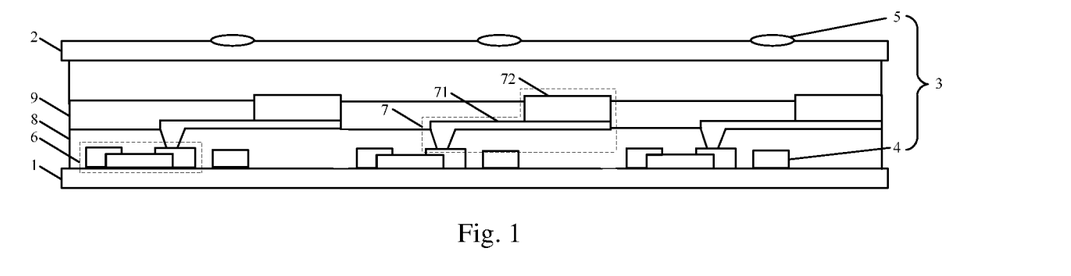
FIG. 1 to FIG. 8 are structural illustrative views one to eight of an integrated display panel according to a first embodiment of the present disclosure.

As illustrated in FIG. 1, an embodiment of the present disclosure provides an integrated display panel comprising a first base substrate 1 and a second base substrate 2, wherein the first base substrate 1 and the second base substrate 2 are disposed opposite to each other. The first base substrate 1 is provided with a pixel unit thereon. The pixel unit comprises a plurality of sub-pixel units having different colors. The integrated display panel further comprises an image acquisition module. The image acquisition module comprises a photo sensing unit 3 disposed in each of the sub-pixel units. The photo sensing unit 3 comprises a photodiode 4 disposed in a non-display region of the sub-pixel unit. The photodiode 4 is configured to photoelectrically convert light from a target area to obtain an electric signal representing an image of the target area. The photo sensing unit 3 further comprises a lens 5 which is configured to acquire light from the target area and increase the luminous flux entering the photodiode 4.

In the integrated display panel according to the embodiment, a plurality of sub-pixel units having different colors are provided, and each of the sub-pixel units is formed with a photodiode 4 therein. Based on the above structure, when the integrated display panel is implemented, the light of a target area acquired by the lens 5 is photoelectrically converted by the photodiode 4, thereby generating an electric signal representing an image of the target area, and thus generating an image of the target area. In case that the photo sensing unit 3 further comprises a lens 5, the lens 5 is configured to acquire light of a target area and increase the luminous flux entering the photodiode 4. It can be appreciated from the implementation process of the integrated display panel that the photodiode 4 being integrated in the sub-pixel unit of the integrated display panel overcomes the problem in a technique known by the inventors, in which the thickness of the entire display device is increased by having the front camera installed in the display device as a separate component. Therefore, with the integrated display panel according to the present embodiment, the thickness of the entire display device can be reduced, which is advantageous for the development of ultra-thin display devices.

In addition, since the photodiode 4 is integrated in the integrated display panel, the integrated display panel not only has a display function but also has a photographing function. Compared with the display panel known to the inventors, the integrated display panel according to the present embodiment has a better integration degree and has a higher use value.

It should be noted that the first base substrate 1 and the second base substrate 2 in the present embodiment can be common glass substrates, and of course can be other transparent substrates that can be applied in the display field. In addition, the integrated display panel can be packaged in a glass powder package to ensure the sealing performance of the integrated display panel.

Referring again to FIG. 1, the lens 5 configured to increase the luminous flux entering the photodiode 4 can also be integrated into the integrated display panel. For example, the lens 5 can be formed on a surface of the second base substrate 2 facing away from the first base substrate 1 by nanoimprinting, and in order to ensure that the light from the target area acquired by the lens 5 is transmitted to the photodiode 4 corresponding thereto, the orthographic projection of the lens 5 on the first base substrate 1 is required to overlap the orthographic projection of the corresponding photodiode 4 on the first base substrate 1.

By forming the lens 5 on the second base substrate 2, namely, also integrating a structure of the lens 5 of the front camera of the prior art into the integrated display panel, the thickness of the entire display device can be further reduced.

Referring again to FIG. 1, each of the sub-pixel units comprises a thin film transistor 6, a light-emitting element 7, a planarization layer 8, and a light transmissive layer 9. The light-emitting element 7 comprises an anode 71 and an organic light-emitting layer 72 made of organic light-emitting materials. The planarization layer 8 overlaps the first base substrate 1, and the photodiode 4 and the thin film transistor 6 located in the sub-pixel unit. The light transmissive layer 9 is formed in a non-display region of the sub-pixel unit. The light transmissive layer 9 is located between the planarization layer 8 and the second base substrate 2. An orthographic projection of light transmissive layer 9 on the first base substrate 1 overlaps an orthographic projection of the photodiode 4 of the sub-pixel unit on the first base substrate 1. The light transmissive layer 9 can be a photoresist layer or can be of a film layer structure made of other light transparent materials.

In one embodiment of the present disclosure, the thin film transistor 6 and the photodiode 4 in the same sub-pixel unit are connected to the same data line, thereby reducing amount of wirings in the driving circuit, simplifying the structure of the driving circuit, and reducing the complexity of the driving circuit.

Based on the structure of the integrated display panel, when the integrated display panel performs display, the light emitted by the light-emitting element 7 is emitted from the upper surface of the second base substrate 2, and the light-emitting mode of the integrated display panel can be set to be a non-micro cavity optical structure and a micro cavity optical structure.

Hereinafter, a structure of the sub-pixel unit in the integrated display panel according to the present embodiment will be described based on the colorization mode of the light-emitting element 7.

Figure 2:
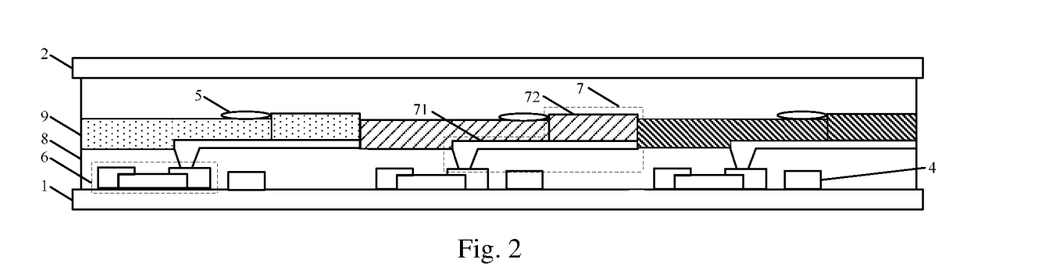

As illustrated in FIG. 2, when the colorization mode of the light-emitting element 7 is independent light emission, the light-emitting element 7 in the sub-pixel unit is an RGB OLED which emits a single-color light. That is to say, the organic light-emitting material of the organic light-emitting layer 72 in the light-emitting element 7 is a color light organic light-emitting material, which can emit one of the RGB light, for example, R light, G light or B light.

In this case, when the integrated display panel performs its display function, a color image display can be realized by relying on the colored light emitted by the RGB OLED, without additionally forming a color filter layer between the RGB OLED and the second base substrate 2 for the filtering purpose. However, when the integrated display panel performs its photographing function, in order to realize color imaging, it is necessary to convert the light from the target area acquired by the lens 5 into colored light. For example, the light from the target area acquired by the lens 5 can be converted into colored light in the following three ways.

The first way: referring again to FIG. 2, the color of the light transmissive layer 9 is made the same as the color of the RGB OLED in the sub-pixel unit where it lies, so that when the light from the target area is transmitted to the light transmissive layer 9 through the lens, it can be converted into colored light by the light transmissive layer 9, and then the converted colored light passes through the planarization layer 8 and is transmitted into the photodiode 4. For example, the light transmissive layer 9 can be formed of a resin having the same color as the color organic light-emitting material of the light-emitting element 7 in the sub-pixel unit where it lies.

The second way: the color of the planarization layer 8 is made the same as the color of the RGB OLED in the sub-pixel unit where it lies, so that when the light from the target area is transmitted to the planarization layer 8 through the light transmissive layer 9 and the lens, it can be converted into colored light by the colored planarization layer 8, and then the converted colored light is transmitted into the photodiode 4. For example, the planarization layer 8 can be formed of a resin having the same color as the color organic light-emitting material of the light-emitting element 7 in the sub-pixel unit where it lies.

The third way: the color of the planarization layer 8 and the color of the light transmissive layer 9 are made the same as the color of the RGB OLED in the sub-pixel unit where it lies, so that when the light of the target area is transmitted to the planarization layer 8 and the light transmissive layer 9, it can be converted into colored light by the colored light transmissive layer 9 and planarization layer 8, and then the converted colored light is transmitted into the photodiode. For example, each of the light transmissive layer 9 and the planarization layer 8 can be formed of a resin having the same color as the color organic light-emitting material of the light-emitting element 7 in the sub-pixel unit where it lies.

When the color of the light transmissive layer 9 and/or the planarization layer 8 is the same as the color of the RGB OLED in the sub-pixel unit where they lie, the light transmissive layer 9 and/or the planarization layer 8 serve as a color filter layer.

Of course, in order to convert the light from the target area acquired by the lens 5 into colored light, a color filter layer can be disposed between the light transmissive layer 9 and the second base substrate 2, and an orthographic projection of the color filter layer on the first base substrate 1 is required to overlap an orthographic projection of the photodiode 4 on the first base substrate 1. When the lens 5 is formed on the second base substrate 2, an orthographic projection of the color filter layer on the second base substrate 2 needs to overlap the corresponding lens 5. The corresponding lens 5 refers to a lens that increases the luminous flux entering the photodiode 4 in the sub-pixel unit corresponding to the color filter layer. At this time, it is not necessary for the light transmissive layer 9 and/or the planarization layer 8 to convert the light from the target area acquired by the lens 5 into colored light, and the light transmissive layer 9 and the planarization layer 8 can be made of a transparent resin.

Figure 3:
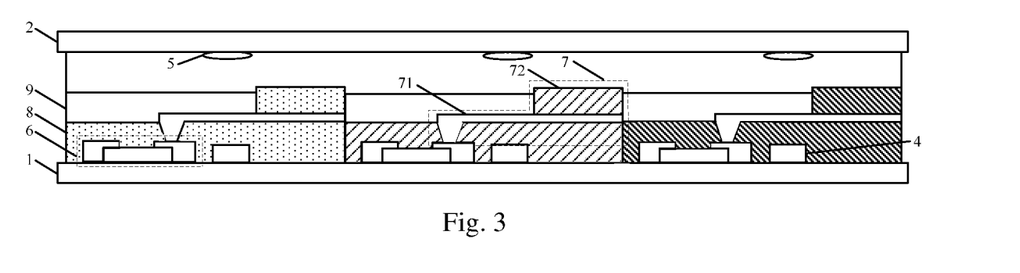

It can be understood that in order to perform color imaging, in the integrated display panel, the light transmissive layer 9 and/or the planarization layer 8 serving as a color filter layer need to be disposed between the lens 5 and the photodiode 4. Therefore, when the color of the light transmissive layer 9 is the same as the color of the RGB OLED in the sub-pixel unit where it lies, the lens 5 is formed between the second base substrate 2 and the light transmissive layer 9 in the corresponding sub-pixel unit, for example, on a surface of the light transmissive layer 9 facing toward the second base substrate 2, as illustrated in FIG. 2, or on a surface of the second base substrate 2 facing toward the light transmissive layer 9, and the orthographic projection of the lens 5 on the first base substrate 1 needs to overlap the corresponding photodiode 4. When the color of the planarization layer 8 is the same as the color of the RGB OLED in the sub-pixel unit where it lies, the lens 5 is formed between the second base substrate 2 and the planarization layer 8 in the corresponding sub-pixel unit, for example, on a surface of the second base substrate 2 facing toward the planarization layer 8, as illustrated in FIG. 3, or on a surface of the planarization layer 8 facing toward the second base substrate 2, and the orthographic projection of the lens 5 on the first base substrate 1 overlaps the corresponding photodiode 4.

Figure 4:
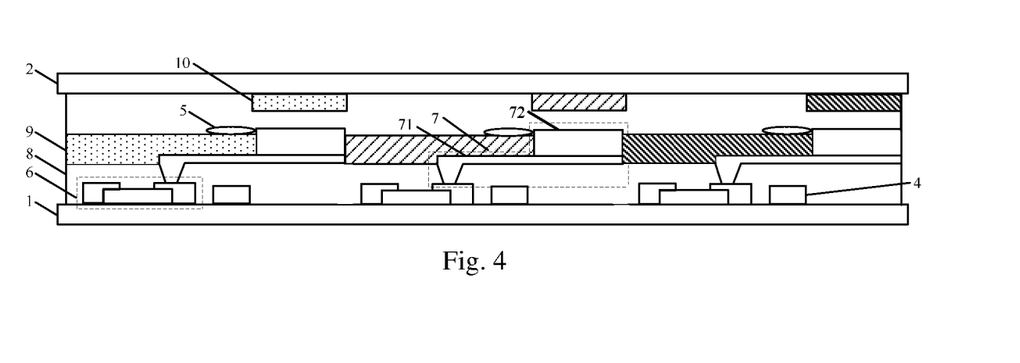

FIG. 4 is a structural illustrative view of the integrated display panel when the light-emitting element 7 is a white light source. As illustrated in FIG. 4, the light-emitting element 7 in the sub-pixel unit is a white OLED that emits white light, namely, the organic light-emitting material of the organic light-emitting layer 72 in the light-emitting element 7 is a white organic light-emitting material.

In this case, since the white OLED can only emit white light and cannot emit colored light, when the integrated display panel performs its display function, it is required to provide a color filter layer that performs color conversion on white light emitted by the white OLED between the white OLED and the second base substrate 2.

For example, the color filter layer can be disposed on the surface of the second base substrate 2 facing toward the white OLED, as illustrated in FIG. 4, or the color filter layer can be disposed on the surface of the organic light-emitting layer of the white OLED facing toward the second base substrate 2.

Referring again to FIG. 4, when the color filter layer 10 is disposed on the surface of the second base substrate 2 facing toward the white OLED, and an orthographic projection of the color filter layer 10 on the second base substrate 2 overlaps only an orthographic projection of the organic light-emitting layer 72 of the corresponding white OLED on the second base substrate 2, the color filter layer 10 can color-convert the white light emitted by the white OLED only when the integrated display panel performs its display function, thereby realizing color image display. When the integrated display panel performs its photographing function, based on the position of the color filter layer 10, the color filter layer 10 cannot convert the light from the target area acquired by the lens 5 into colored light and transmit it to the photodiode 4. Therefore, in order to color-convert the light from the target area acquired by the lens 5, the color of the light transmissive layer 9 can be made the same as the color of the color filter layer 10 in the sub-pixel unit where it lies, as illustrated in FIG. 4; and/or the color of the planarization layer 8 can be made the same as the color of the color filter layer 10 in the sub-pixel unit where it lies, as illustrated in FIG. 5.

FIG. 4 is a structural illustrative view in which the lens 5 is disposed on a surface of the light transmissive layer 9 facing toward the second base substrate 2 when the light-emitting element 7 in the sub-pixel unit is a white OLED which emits white light and the color of the light transmissive layer 9 is the same as the color of the color filter layer 10 in the sub-pixel unit where it lies. Of course, when the light-emitting element 7 in the sub-pixel unit is a white OLED which emits white light and the color of the light transmissive layer 9 is the same as the color of the color filter layer 10 in the sub-pixel unit where it lies, the lens 5 can also be disposed on a surface of the second substrate 2 facing toward the light transmissive layer 9.

Figure 5:
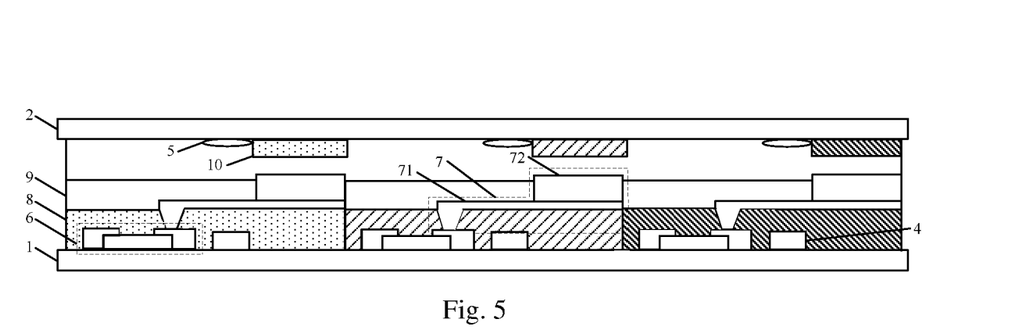

FIG. 5 is a structural illustrative view in which the lens 5 is disposed on a surface of the second substrate 2 facing toward the planarization layer 8 when the light-emitting element 7 in the sub-pixel unit is a white OLED which emits white light and the color of the planarization layer 8 is the same as the color of the color filter layer 10 in the sub-pixel unit where it lies. Of course, when the light-emitting element 7 in the sub-pixel unit is a white OLED which emits white light and the color of the planarization layer 8 is the same as the color of the color filter layer 10 in the sub-pixel unit where it lies, the lens 5 can also be disposed on a side of the planarization layer 8 facing toward the second substrate 2.

When the color of the light transmissive layer 9 and/or the planarization layer 8 is the same as the color of the color filter layer 10 in the sub-pixel unit where it lies, the light transmissive layer 9 and/or the planarization layer 8 can convert the light from the target area acquired by the lens 5 into colored light and then transmit it to the photodiode 4, and thus serving as a color filter layer.

Similarly, when the color filter layer is disposed on the surface of the organic light-emitting layer 72 of the white OLED facing toward the second base substrate 2, in order to make the integrated display panel achieve color imaging during the photographing process, the color of the light transmissive layer 9 and/or the planarization layer 8 can be the same as the color of the color filter layer in the sub-pixel unit where it lies, so that the light from the target area acquired by the lens 5 can be converting into colored light. In such a configuration, the lens 5 can be disposed on a side of the second base substrate 2 facing toward the light transmissive layer 9, or the lens 5 can be disposed on a side of the light transmissive layer 9 facing toward the second substrate 2.

For example, in order to make the color of the light transmissive layer 9 and/or the planarization layer 8 the same as the color of the color filter layer 10 in the sub-pixel unit where it lies, the light transmissive layer 9 and/or the planarization layer 8 can be formed of a resin having the same color as the color filter layer 10 in the sub-pixel unit where it lies.

Figure 6:
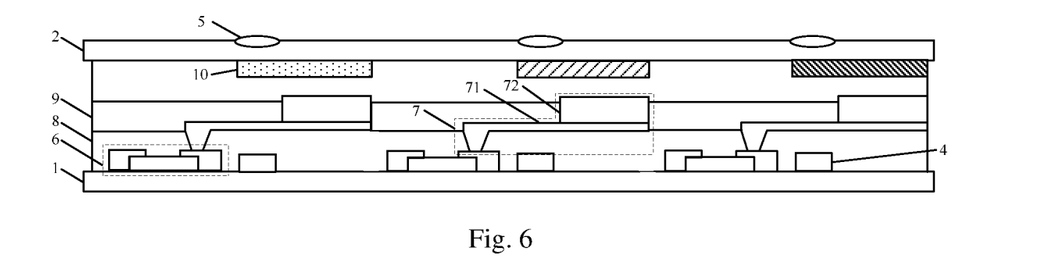

Of course, when the light from the target area acquired by the lens 5 is converted into colored light, a color filter layer for color conversion can be disposed between the light transmissive layer 9 and the second base substrate 2. And, an orthographic projection of the color filter layer on the first base substrate 1 needs to overlap an orthographic projection of the photodiode 4 on the first base substrate 1. As illustrated in FIG. 6, the color filter layer 10 is positioned between the second base substrate 2 and the organic light-emitting layer 72. The orthographic projection of the color filter layer 10 on the first base substrate 1 not only overlaps the projection of the organic light-emitting layer 72 on the first substrate, but also overlaps the orthographic projection of the photodiode 4 on the first base substrate 1. When the lens 5 is formed on the second base substrate 2, an orthographic projection of the color filter layer on the second base substrate 2 needs to overlap the lens 5. At this time, it is not necessary for the light transmissive layer 9 and/or the planarization layer 8 to convert the light from the target area acquired by the lens 5 into colored light, and the light transmissive layer 9 and/or the planarization layer 8 can be made of a transparent resin.

It can be understood that, in order to realize color imaging by the integrated display panel, the light transmissive layer 9 and/or the planarization layer 8 serving as a color filter layer needs to be disposed between the lens 5 and the photodiode 4. Therefore, when the color of the light transmissive layer 9 is the same as the color of the color filter layer 10 in the sub-pixel unit where it lies, the lens 5 can be formed between the second base substrate 2 and the light transmissive layer 9 in the corresponding sub-pixel unit, for example, on the surface of the light transmissive layer 9 facing toward the second base substrate 2 or the surface of the second base substrate 2 facing toward the light transmissive layer 9, and an orthographic projection of the lens 5 on the first base substrate 1 needs to overlap the corresponding photodiode 4. FIG. 4 is an illustrative view of the lens 5 being formed on the surface of the light transmissive layer 9 facing toward the second base substrate 2. When the color of the planarization layer 8 is the same as the color of the color filter layer 10 in the sub-pixel unit where it lies, the lens 5 can be formed between the second base substrate 2 and the planarization layer 8 in the corresponding sub-pixel unit, for example, on the surface of the planarization layer 8 facing toward the second base substrate 2 or the surface of the second base substrate 2 facing toward the planarization layer 8, and an orthographic projection of the lens 5 on the first base substrate 1 overlaps the corresponding photodiode 4. At this time, the thus-formed lens 5 is a microlens 5. Here, an illustrative view in which the lens 5 is formed on the surface of the second base substrate 2 facing toward the planarization layer 8 is as illustrated in FIG. 5.

As illustrated in FIG. 6, when the color filter layer 10 is disposed on the surface of the second base substrate 2 facing toward the white OLED, and an orthographic projection of the color filter layer 10 on the second base substrate 2 overlaps the organic light-emitting layer 72 of the corresponding white OLED and the photodiode 4, the lens 5 can be formed on the surface of the second base substrate 2 facing away from the first base substrate 1 by nanoimprinting, and an orthographic projection of the lens 5 on the first base substrate 1 needs to overlap the corresponding photodiode 4. The color filter layer 10 not only can perform color conversion on white light emitted by the white OLED when the integrated display panel performs its display function, but also can convert the light from the target area acquired by the lens 5 into colored light and transmit it to the photodiode 4 to realize color imaging when the integrated display panel performs its photographing function. At this time, the light transmissive layer 9 and the planarization layer 8 can be formed of transparent resin.

Figure 7:
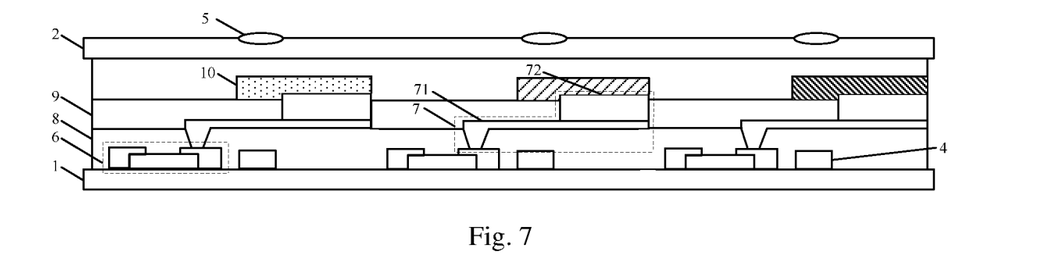

Similarly, as illustrated in FIG. 7, when an color filter layer 10 is formed on the surface of the organic light-emitting layer of the white OLED facing toward the second base substrate 2, and when an color filter layer 10 is also formed on the surface of the light transmissive layer 9 facing toward the second base substrate 2, an lens 5 can be formed on the surface of the second base substrate 2 facing away from the first base substrate 1 by nanoimprinting, and an orthographic projection of the lens 5 on the first base substrate 1 needs to overlap the corresponding photodiode 4. An orthographic projection of the color filter layer 10 on the first base substrate 1 overlaps the organic light-emitting layer 72 of the corresponding white OLED and the photodiode 4. At this time, the color filter layer 10 can be configured for color image display when the integrated display panel performs its display function and can be configured for color imaging when the integrated display panel performs its photographing function. At this time, the light transmissive layer 9 and the planarization layer 8 can be formed of transparent resin.

It can be understood that when the lens 5 is formed on the second base substrate 2, an orthographic projection of the color filter layer on the second base substrate 2 also needs to overlap the corresponding lens 5.

It should be noted that when the colorization of the light-emitting element 7 is achieved through white light plus color filter, the length of the color filter layer 10 in a direction parallel to the second base substrate 2 is relevant to the pixel density of the display device.

For example, when the display device has a relatively high pixel density, the number of sub-pixel units in each unit area will be relatively great, that is, the space occupied by each sub-pixel unit will be relatively small. Thus, the length of the color filter layer 10 in the direction parallel to the second base substrates 2 needs to be shorter, for example, the orthographic projection of the color filter layer on the first base substrate 1 can overlap only the organic light-emitting layer 72 of the white OLED.

When the display device has a relatively low pixel density, the number of sub-pixel units in each unit area will be relatively small, that is, the space occupied by each sub-pixel unit will be relatively large. Thus, the length of the color filter layer 10 in the direction parallel to the second base substrates 2 needs to be longer, for example, the orthographic projection of the color filter layer on the first base substrate 1 can overlap the organic light-emitting layer 72 of the white OLED and the photodiode 4.

Figure 8:
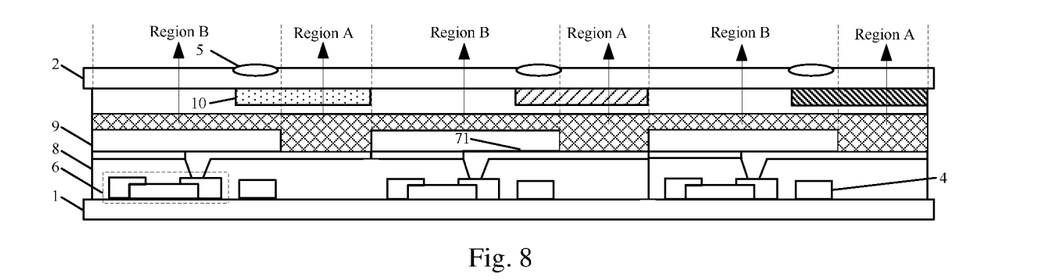

It should be noted that, in the actual preparation process, when the colorization is achieved by single color light emission, RGB OLEDs can be prepared through a mask, and organic light-emitting layers 72 of the RGB OLEDs are formed in the display region of the sub-pixel units, as illustrated in FIG. 2. When the colorization is achieved through white light plus color filter, there are two ways to form a white OLED. One way has a principle which is the same as the principle of making the RGB OLEDs, in which, through a mask, an organic light-emitting layer 72 is formed in the display region of the sub-pixel unit, namely, that is, a region between the light transmissive layers 9 in two adjacent sub-pixel units, as illustrated in FIG. 4. The other way is to overlap the surface of the light transmissive layer 9 facing toward the second base substrate 2 with an entire layer of material without a mask, as illustrated in FIG. 8.

It should be noted, however, that when a white OLED is formed through coating an entire layer of material, other components of the white OLED, such as electrodes, are only formed in the region A, so that light can be emitted from the region A. While there are no other component of the white OLED formed in the region B, and thus light is not emitted from the region B. The nature of the second way for preparing the white OLED is similar to that of the first way for preparing the white OLED.

When the white OLED is formed in such a manner that the surface of the light transmissive layer 9 facing toward the second base substrate 2 is overlapped by an entire layer of material, in order to achieve the function of display and photographing of the integrated display panel, referring to FIG. 8 again, the color filter layer 10 can be disposed on the surface of the second base substrate 2 facing toward the white OLED, and an orthographic projection of the color filter layer 10 on the second base substrate 2 overlaps the display region in the sub-pixel unit and the photodiode 4 in the non-display region. In addition, a lens 5 can be formed on the surface of the second base substrate 2 facing away from the first base substrate 1 by nanoimprinting, and an orthographic projection of the lens 5 on the first base substrate 1 is required to overlap the orthographic projection of the photodiode 4 on the first base substrate 1.

At least one embodiment of the present disclosure provides a manufacturing method of an integrated display panel, the manufacturing method of the integrated display panel is corresponding to the integrated display panel according to Embodiment One.

Figure 9:
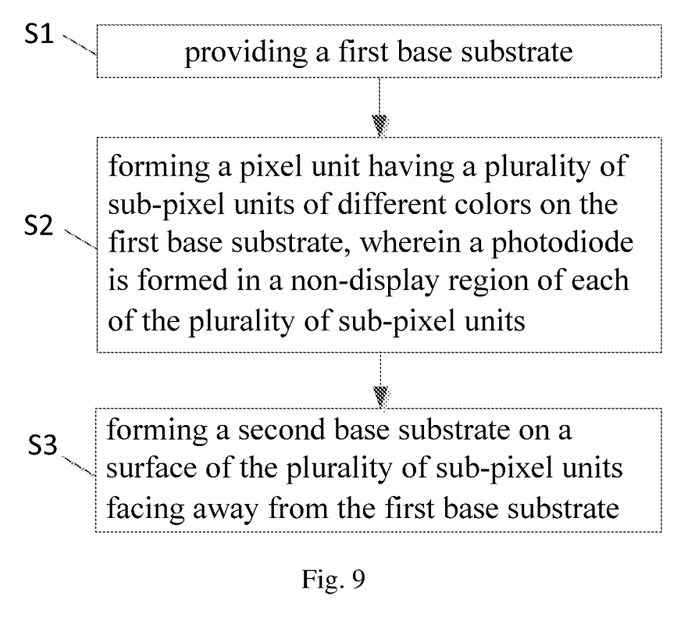
FIG. 9 is a schematic flow chart of a manufacturing method of an integrated display panel according to a second embodiment of the present disclosure.

As illustrated in FIG. 9, the manufacturing method of the integrated display panel provided by the present embodiment comprises:

providing a first base substrate;

forming a pixel unit having a plurality of sub-pixel units of different colors on the first base substrate, wherein a photodiode is formed in a non-display region of each of the plurality of sub-pixel units, the photodiode is configured to photoelectrically convert light from the target area so as to generate an electric signal representing the image of the target area; and forming a second base substrate on a surface of the plurality of sub-pixel units facing away from the first base substrate.

The integrated display panel manufactured by the manufacturing method of the integrated display panel provided by the present embodiment is incorporated with a photodiode structure in the front camera in the technique known to the inventors, and thus can overcome the problem in the technique known by the inventors, in which the thickness of the entire display device is increased by having the front camera installed in the display device as a separate component.

In addition, the integrated display panel manufactured by the manufacturing method of the integrated display panel provided by the present embodiment not only has the display function of the general display panel, but also has the photographing function, and thus has higher use value.

After forming the second base substrate on a surface of the plurality of sub-pixel units facing away from the first base substrate, the method can further comprise: forming a lens on a surface of the second base substrate facing away from the first base substrate by nanoimprinting, wherein an orthographic projection of the lens on the first base substrate overlaps an orthographic projection of the photodiode on the first base substrate.

Through the above method, by forming the lens on the second base substrate, namely, the lens structure in the front camera in the technology known by the applicant is also integrated in the integrated display panel, the thickness of the entire display device can be further reduced.

Forming a plurality of sub-pixel units having different colors on the first base substrate can comprise forming a thin film transistor and a photodiode in each of the sub-pixel units, the thin film transistor and the photodiode formed directly or indirectly on the first base substrate, wherein the thin film transistor and the photodiode are connected to the same data line. By connecting the thin film transistor and the photodiode to the same data line, wirings in the driving circuit can be reduced, the structure of the driving circuit can be simplified, and the complexity of the driving circuit can be reduced.

In addition, forming a plurality of sub-pixel units having different colors on the first base substrate further comprises:

forming a planarization layer on a surface of the first base substrate, a surface of the thin film transistor, and a surface of the photodiode; forming a light-emitting element and a light transmissive layer on a surface of the planarization layer facing away from the first base substrate; wherein an orthographic projection of the light transmissive layer on the first base substrate overlaps an orthographic projection of the photodiode on the first base substrate. In practical applications, the light transmissive layer can be a photoresist layer or can be of a film layer structure made of other light transmissive materials.

When the colorization of the light-emitting element is color light emission, the light-emitting element is a monochrome OLED. Correspondingly, forming the light-emitting element on the surface of the planarization layer facing away from the first base substrate can comprise: forming the organic light-emitting layer on the surface of the planarization layer facing away from the first base substrate through an color organic light-emitting material.

In this case, since the light-emitting element can independently emit color light, when the integrated display panel performs its display function, a color image display can be realized without forming a color filter layer between the light-emitting element and the second base substrate. When the integrated display panel performs its photographing function, in order to achieve color imaging, it is necessary to convert the light from the target area acquired by the lens into colored lights, and thus color of the light transmissive layer can be made the same as color of the monochrome OLED, and/or, color of the planarization layer is made the same as the color of the monochrome OLED. At this time, the light transmissive layer and/or the planarization layer acts as a color filter layer. When the light transmissive layer functions as a color filter layer, the lens is disposed over the light transmissive layer. When the planarization layer functions as a color filter layer, the lens is disposed over the planarization layer.

When the color of the light transmissive layer is made the same as the color of the monochrome OLED, correspondingly, forming the light transmissive layer on the surface of the planarization layer facing away from the first base substrate can comprise: forming the light transmissive layer on the surface of the planarization layer facing away from the first base substrate through a resin having the same color as the color organic light-emitting material in the light-emitting element in the sub-pixel unit where it lies.

When the color of the planarization layer is made the same as the color of the monochrome OLED, correspondingly, forming a planarization layer on a surface of the first base substrate, a surface of the thin film transistor, and a surface of the photodiode can comprise forming a planarization layer on the surface of the first base substrate, the surface of the thin film transistor, and the surface of the photodiode through a resin having the same color as the color organic light-emitting material in the light-emitting element.

In order to increase the luminous flux entering the photodiode, a lens is formed above the photodiode. In order to convert the light from the target area acquired by the lens into colored lights, a color filter layer can be provided between the light transmissive layer and the second base substrate, and an orthographic projection of the color filter layer on the first base substrate overlaps an orthographic projection of the photodiode on the first base substrate. When the lens is formed on the second base substrate, an orthographic projection of the color filter layer on the second base substrate is required to overlap an orthographic projection of the lens on the second base substrate. At this time, the light transmissive layer and the planarization layer can be made of a transparent resin.

It can be understood that, in order to achieve color imaging by the integrated display panel, the light transmissive layer and/or the planarization layer acting as the color filter layer is required to be disposed between the lens and the photodiode. Therefore, when the light transmissive layer is formed of the resin having the same color as the monochrome OLED, after the light transmissive layer is formed on the surface of the planarization layer facing away from the first base substrate, the method can further comprise: forming a lens made of a photosensitive resin on the surface of the light transmissive layer facing toward the second base substrate. When the planarization layer is formed of a resin having the same color as the monochrome OLED, after the planarization layer is formed on the surface of the first base substrate, the surface of the thin film transistor, and the surface of the photodiode, the method further comprises: forming a lens made of a photosensitive resin on a surface of the planarization layer facing toward the second base substrate.

When the colorization of the light-emitting element is achieved through white light plus color filter, the light-emitting element is a white OLED which emits white light. And correspondingly, forming the light-emitting element on the surface of the planarization layer facing away from the first base substrate can comprise: forming the organic light-emitting layer through the white organic light-emitting material on the surface of the planarization layer facing away from the first base substrate.

In this case, since the light-emitting element can only emit white light and cannot emit colored light, when the integrated display panel performs the display function, it is necessary to form a color filter layer between the light-emitting element and the second base substrate, so as to perform color conversion on the white light emitted by the white OLED. Therefore, after forming the pixel unit having a plurality of sub-pixel units of different colors on the first base substrate, the method further comprises: forming a color filter layer between the second base substrate and the light-emitting element. For example, a color filter layer can be formed on a surface of the second base substrate facing toward the light-emitting element, or a color filter layer can be formed on a surface of the light-emitting element facing toward the second base substrate.

When a color filter layer is formed on the surface of the second base substrate facing toward the white OLED, and an orthographic projection of the formed color filter layer on the first base substrate overlaps only an orthographic projection of the organic light-emitting layer of the white OLED on the first base substrate, the color filter layer can only perform color conversion on white light emitted by the white OLED when the integrated display panel realizes its display function, thereby achieving color image display. When the integrated display panel performs its photographing function, the color filter layer cannot convert the light from the target area acquired by the lens into colored light and transmit it to the photodiode. Therefore, in order to convert the light from the target area into colored light, the color of the light transmissive layer can be made the same as the color of the color filter layer; and/or the color of the planarization layer can be made the same as the color of the color filter layer.

Similarly, when the color filter layer is disposed on the surface of the white OLED facing toward the second base substrate, in order to achieve color imaging by the integrated display panel during photographing, the color of the light transmissive layer can be made the same as the color of the color filter layer; and/or the color of the planarization layer can be made the same as the color of the color filter layer.

When the color of the light transmissive layer is the same as the color of the color filter layer, correspondingly, forming the light transmissive layer on the surface of the planarization layer facing away from the first base substrate can further comprise: forming the light transmissive layer through a resin having the same color as the color filter layer on the surface of the planarization layer facing away from the first base substrate.

When the color of the planarization layer is the same as the color of the color filter layer, correspondingly, forming a planarization layer on the surface of the first base substrate, the surface of the thin film transistor, and the surface of the photodiode can comprise: forming a planarization layer on the surface of the first base substrate, the surface of the thin film transistor, and the surface of the photodiode through a resin having the same color as the color filter layer in the light-emitting element.

It can be understood that, in order to achieve color imaging by the integrated display panel, the light transmissive layer and/or the planarization layer acting as the color filter layer is required to be disposed between the lens and the photodiode. Therefore, when the light transmissive layer is formed of the resin having the same color as the color filter layer, after the light transmissive layer is formed on the surface of the planarization layer facing away from the first base substrate, the method can further comprise forming a lens made of a photosensitive resin on the surface of the light transmissive layer facing toward the second base substrate. When the planarization layer is formed of a resin having the same color as the color filter layer, after forming the planarization layer on the surface of the first base substrate, the surface of the thin film transistor, and the surface of the photodiode, the method further comprises: forming a lens of a photosensitive resin on a surface of the planarization layer facing toward the second base substrate.

When a color filter layer is formed on a surface of the light-emitting element facing toward the second base substrate, and an orthographic projection of the formed color filter layer on the first base substrate can overlap not only an orthographic projection of the organic light-emitting layer of the white OLED on the first base substrate but also an orthographic projection of the photodiode on the first base substrate, the color filter layer not only can perform color conversion on white light emitted by the white OLED to achieve color image display when the integrated display panel performs its display function, but also can convert the light from the target area acquired by the lens into colored light and transmit it to the photodiode to achieve color imaging when the integrated display panel performs its photographing function. At this time, the light transmissive layer and the planarization layer can be formed of transparent resin.

Similarly, when the color filter layer is formed on the surface of the light transmissive layer facing toward the second base substrate in addition to the surface of the light-emitting element facing toward the second base substrate, an orthographic projection of the color filter layer on the second base substrate overlaps the organic light-emitting layer of the white OLED and the photodiode. At this time, the light transmissive layer and the planarization layer can be formed of transparent resin.

At least one embodiment of the present disclosure provides a display device comprising the integrated display panel as described above and a driving circuit that drives the integrated display panel.

In the technique known to the inventors, the display device comprises not only a driving circuit for driving the display panel but also a driving circuit for driving the front camera, and the two driving circuits are independent of each other. Since the photodiode is integrated in the integrated display panel according to the embodiment of the present disclosure, that is, a partial structure of the front camera of the display panel known to the inventors is incorporated, in the display device according to the embodiment of the present disclosure, the integrated display panel can be driven by only one driving circuit, to achieve the display function and the photographing function. Therefore, in comparison with the technique known to the inventors, in the display device according to the embodiment of the present disclosure, it is not necessary to separately provide a driving circuit for driving the front camera, thereby reducing the thickness of the entire display device.

The foregoing are merely exemplary embodiments of the disclosure, but the scope of protection of the present disclosure is not limited thereto. The protection scope of the disclosure shall be defined by the attached claims.

The present disclosure claims priority of Chinese Patent Application No. 201710209046.8 filed on Mar. 31, 2017, the disclosure of which is hereby entirely incorporated by reference as a part of the present disclosure.

The invention claimed is:

1. An integrated display panel, comprising a first base substrate and a second base substrate, the first base substrate and the second base substrate being disposed opposite to each other, the first base substrate being provided with a pixel unit thereon, the pixel unit comprising a plurality of sub-pixel units having different colors;

the integrated display panel further comprises an image acquisition module which comprises a photo sensing unit disposed in each of the sub-pixel units, the photo sensing unit comprises a photodiode positioned in a non-display region of the sub-pixel unit, the photodiode is configured to photoelectrically convert light from a target area to obtain an electric signal representing an image of the target area, wherein each of the plurality of sub-pixel units comprises a thin film transistor, and the thin film transistor and the photodiode in the sub-pixel unit are connected to the same data line;

each of the plurality of sub-pixel units further comprises a light-emitting element, a planarization layer, and a light transmissive layer;

wherein the planarization layer overlaps the first base substrate, the thin film transistor and the photodiode; and an orthographic projection of the light transmissive layer on the first base substrate overlap an orthographic projection of the photodiode on the first base substrate, and the light transmissive layer is located in the non-display region of the sub-pixel unit and is located between the planarization layer and the second base substrate.

2. The integrated display panel according to claim 1, wherein the photo sensing unit further comprises a lens which is disposed above the photodiode and is configured to increase a luminous flux entering the photodiode.

3. The integrated display panel according to claim 2, wherein the lens is formed on the second base substrate, and an orthographic projection of the lens on the first base substrate overlaps an orthographic projection of the photodiode on the first base substrate.

4. The integrated display panel according to claim 1, wherein the light-emitting element is a monochrome OLED; a color of the light transmissive layer is the same as a color of the monochrome OLED in the sub-pixel unit;

and/or a color of the planarization layer is the same as the color of the monochrome OLED in the sub-pixel unit.

5. The integrated display panel according to claim 4, wherein
when the color of the light transmissive layer is the same as the color of the monochrome OLED in the sub-pixel unit, the lens is formed between the light transmissive layer and the second base substrate, wherein an orthographic projection of the lens on the first base substrate overlap an orthographic projection of the photodiode on the first base substrate;
when the color of the planarization layer is the same as the color of the monochrome OLED in the sub-pixel unit, the lens is formed between the planarization layer and the second base substrate, wherein an orthographic projection of the lens on the first base substrate overlaps an orthographic projection of the photodiode on the first base substrate.

6. The integrated display panel according to claim 1, wherein the light-emitting element is a white OLED;
a color filter layer is formed on a surface of the second base substrate facing toward the white OLED, a color of the color filter layer is the same as the sub-pixel unit, and an orthographic projection of the color filter layer on the first base substrate overlap only an orthographic projection of an organic light-emitting layer of the white OLED on the first base substrate or overlaps orthographic projections of an organic light-emitting layer of the white OLED and the photodiode on the first base substrate;
when the orthographic projection of the color filter layer on the first base substrate overlaps only the orthographic projection of the organic light-emitting layer of the white OLED, a color of the light transmissive layer is the same as the color of the color filter layer and/or a color of the planarization layer is the same as the color of the color filter layer.

7. The integrated display panel according to claim 6, wherein
when the color of the light transmissive layer is the same as the color of the color filter layer, the lens is formed between the light transmissive layer and the second base substrate, wherein an orthographic projection of the lens on the first base substrate overlaps an orthographic projection of the photodiode on the first base substrate;
when the color of the planarization layer is the same as the color of the color filter layer, the lens is formed between the planarization layer in the sub-pixel unit and the second base substrate, wherein the orthographic projection of the lens on the first base substrate overlaps the orthographic projection of the photodiode on the first base substrate.

8. The integrated display panel according to claim 1, wherein the light-emitting element is a white OLED, and a color filter layer is formed on a surface of the white OLED facing toward the second base substrate, the color of the color filter layer is the same as the sub-pixel unit;
a color of the light transmissive layer is the same as a color of the color filter layer;
and/or a color of the planarization layer is the same as the color of the color filter layer;
and/or the color filter layer is further formed on a surface of the light transmissive layer facing toward the second base substrate, and an orthographic projection of the color filter layer on the first base substrate further overlaps an orthographic projection of the photodiode on the first base substrate.

9. A manufacturing method of the integrated display panel according to claim 1, comprising:
providing a first base substrate;
forming a pixel unit having a plurality of sub-pixel units of different colors on the first base substrate, wherein a photodiode is formed in a non-display region of each of the plurality of sub-pixel units, the photodiode is configured to photoelectrically convert light from the target area so as to generate an electric signal representing the image of the target area; and
forming a second base substrate on a surface of the pixel unit facing away from the first base substrate,
wherein forming the pixel unit having the plurality of sub-pixel units of different colors on the first base substrate further comprises:
forming a thin film transistor and the photodiode in the sub-pixel unit, the thin film transistor and the photodiode being positioned on the first base substrate, wherein the thin film transistor and the photodiode are connected to the same data line;
forming the planarization layer on a surface of the first base substrate, a surface of the thin film transistor, and a surface of the photodiode; and
forming a light-emitting element and a light transmissive layer on a surface of the planarization layer facing away from the first base substrate; wherein an orthographic projection of the light transmissive layer on the first base substrate overlaps an orthographic projection of the photodiode on the first base substrate.

10. The manufacturing method of the integrated display panel according to claim 9, wherein
after forming the second base substrate on the surface of the pixel unit facing away from the first base substrate, the method further comprises: forming a lens on a surface of the second base substrate facing away from the first base substrate by nanoimprinting, wherein an orthographic projection of the lens on the first base substrate overlaps an orthographic projection of the photodiode on the first base substrate.

11. The manufacturing method of the integrated display panel according to claim 9, wherein
forming the light-emitting element on a surface of the planarization layer facing away from the first base substrate comprises: forming an organic light-emitting layer of the light-emitting element on the surface of the planarization layer facing away from the first base substrate through a color organic light-emitting material;
forming the light transmissive layer on a surface of the planarization layer facing away from the first base substrate comprises: forming the light transmissive layer on the surface of the planarization layer facing away from the first base substrate through a resin having a same color as the color organic light-emitting material of the light-emitting element; and/or
forming the planarization layer on a surface of the first base substrate, a surface of the thin film transistor in the sub-pixel unit, and a surface of the photodiode comprises: forming a planarization layer on a surface of the first base substrate, a surface of the thin film transistor, and a surface of the photodiode by a resin having a same color as the color organic light-emitting material of the light-emitting element.

12. The manufacturing method of the integrated display panel according to claim 11, further comprising forming a lens on the light transmissive layer when the light transmissive layer is formed of a resin having a same color as the color organic light-emitting material of the light-emitting element, wherein an orthographic projection of the lens on the first base substrate overlaps an orthographic projection of the photodiode on the first base substrate.

13. The manufacturing method of the integrated display panel according to claim 11, further comprising forming a lens on the planarization layer when the planarization layer is formed of a resin having a same color as the color organic light-emitting material of the light-emitting element, wherein an orthographic projection of the lens on the first base substrate overlaps an orthographic projection of the photodiode on the first base substrate.

14. The manufacturing method of the integrated display panel according to claim 9, wherein
forming a light-emitting element on a surface of the planarization layer facing away from the first base substrate comprises: forming an organic light-emitting layer of the light-emitting element through a white organic light-emitting material on a surface of the planarization layer facing away from the first base substrate;
after forming the pixel unit having a plurality of sub-pixel units of different colors on the first base substrate, the method further comprises: forming a color filter layer on a surface of the second base substrate facing toward the light-emitting element, and an orthographic projection of the color filter layer on the first base substrate overlaps only an orthographic projection of the organic light-emitting layer of the light-emitting element on the first base substrate or overlaps orthographic projections of the organic light-emitting layer of the light-emitting element and the photodiode on the first base substrate;
when the orthographic projection of the color filter layer on the first base substrate overlaps only the orthographic projection of the organic light-emitting layer of the light-emitting element on the first base substrate,
forming a light transmissive layer on the surface of the planarization layer facing away from the first base substrate comprises: forming a light transmissive layer on the surface of the planarization layer facing away from the first base substrate through a resin having a same color as the color filter layer; and/or
forming a planarization layer on a surface of the first base substrate, a surface of the thin film transistor, and a surface of the photodiode comprises forming a planarization layer on the surface of the first base substrate, the surface of the thin film transistor, and the surface of the photodiode by a resin having a same color as the color filter layer.

15. The manufacturing method of the integrated display panel according to claim 14, wherein when the light transmissive layer is formed of a resin having the same color as the color filter layer, a lens is formed between the light transmissive layer and the second base substrate, and an orthographic projection of the lens on the first base substrate overlaps an orthographic projection of the photodiode on the first base substrate.

16. The manufacturing method of the integrated display panel according to claim 14, wherein when the planarization layer is formed of a resin having the same color as the color filter layer, a lens is formed between the planarization layer and the second base substrate, and an orthographic projection of the lens on the first base substrate overlaps an orthographic projection of the photodiode on the first base substrate.

17. The manufacturing method of the integrated display panel according to claim 9, wherein
forming a light-emitting element on a surface of the planarization layer facing away from the first base substrate comprises: forming an organic light-emitting layer of the light-emitting element through a white organic light-emitting material on the surface of the planarization layer facing away from the first base substrate;
after forming the pixel unit having a plurality of sub-pixel units of different colors on the first base substrate, the method further comprises: forming a color filter layer on a surface of the light-emitting element facing toward the second base substrate,
forming a light transmissive layer on a surface of the planarization layer facing away from the first base substrate comprises: forming the light transmissive layer on the surface of the planarization layer facing away from the first base substrate through a resin having a same color as the color filter layer; and/or
forming the planarization layer on a surface of the first base substrate, a surface of the thin film transistor, and a surface of the photodiode comprises forming the planarization layer on the surface of the first base substrate, the surface of the thin film transistor, and the surface of the photodiode through a resin having a same color as the color filter layer.

18. A display device, comprising an integrated display panel according to claim 1 and a driving circuit for driving the integrated display panel.

* * * * *